(12) United States Patent
Xu et al.

(10) Patent No.: US 10,551,742 B2
(45) Date of Patent: Feb. 4, 2020

(54) TUNABLE ADHESION OF EUV PHOTORESIST ON OXIDE SURFACE

(71) Applicant: International Business Machines Corporation, Armonk, NY (US)

(72) Inventors: Yongan Xu, Niskayuna, NY (US); Jing Guo, Niskayuna, NY (US); Ekmini A. De Silva, Slingerlands, NY (US); Oleg Gluschenkov, Tannersville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 15/848,471

(22) Filed: Dec. 20, 2017

(65) Prior Publication Data
US 2019/0187565 A1    Jun. 20, 2019

(51) Int. Cl.
| | | |
|---|---|---|
| G03F 7/20 | (2006.01) | |
| H01L 21/027 | (2006.01) | |
| G03F 7/075 | (2006.01) | |
| G03F 7/085 | (2006.01) | |

(52) U.S. Cl.
CPC .......... *G03F 7/2002* (2013.01); *G03F 7/0751* (2013.01); *G03F 7/085* (2013.01); *G03F 7/70033* (2013.01); *H01L 21/0275* (2013.01)

(58) Field of Classification Search
CPC .................................................... G03F 7/2002
See application file for complete search history.

(56) References Cited

U.S. PATENT DOCUMENTS

| | | | |
|---|---|---|---|
| 4,176,003 A | 11/1979 | Brower et al. | |
| 5,045,345 A | 9/1991 | Singer | |
| 6,066,578 A | 5/2000 | Gupta et al. | |
| 6,165,695 A | 12/2000 | Yang et al. | |
| 6,533,907 B2 | 3/2003 | Demaray et al. | |
| 6,806,203 B2 | 10/2004 | Weidman et al. | |
| 7,642,195 B2 | 1/2010 | Yeh | |
| 2007/0154851 A1 | 7/2007 | Ahn et al. | |
| 2014/0094038 A1 | 4/2014 | Haverkamp et al. | |
| 2014/0187050 A1* | 7/2014 | Posseme | H01L 21/3081 438/717 |
| 2015/0206739 A1* | 7/2015 | Manna | H01L 21/0271 428/195.1 |
| 2018/0203355 A1* | 7/2018 | De Silva | G03F 7/11 |
| 2018/0204723 A1* | 7/2018 | Chen | H01L 21/0274 |

OTHER PUBLICATIONS

Seshadri et al., "Ultrathin EUV patterning stack using polymer brush as an adhesion promotion layer," Proc. of SPIE, vol. 10143, 2017, 101431D, 11 pages.

* cited by examiner

*Primary Examiner* — Kathleen Duda
(74) *Attorney, Agent, or Firm* — Cantor Colburn LLP; Vazken Alexanian

(57) ABSTRACT

An EUV lithographic structure and methods according to embodiments of the invention includes an EUV photosensitive resist layer disposed directly on an oxide hardmask layer, wherein the oxide hardmask layer is doped with dopant ions to form a doped oxide hardmask layer so as to improve adhesion between the EUV lithographic structure and the oxide hardmask. The EUV lithographic structure is free of a separate adhesion layer.

18 Claims, 3 Drawing Sheets

TUNABLE ADHESION OF EUV PHOTORESIST ON OXIDE SURFACE

BACKGROUND

The present invention generally relates to semiconductor integrated circuits, and more particularly, to image transfer processes employing an extreme ultraviolet lithography (also known as EUV or EUVL) on oxide surfaces.

EUV is a next-generation lithography technology using an extreme ultraviolet wavelength, currently expected to be 13.5 nm. EUV photosensitive resists are often deposited on an adhesion layer overlaying an oxide hardmask layer because of poor adhesion, which generally manifests itself as pattern collapse. Different EUV photoresists will have different adhesive properties. An EUV photoresist having too strong of an adhesion can result in residue formation and scumming.

SUMMARY

Described herein are methods for improving adhesion of an EUV photosensitive resist deposited directly on an oxide layer and EUV lithographic structures according to aspects of the invention. In one or more embodiments of the invention, the method includes forming an organic planarizing layer over a semiconductor substrate, the organic planarizing layer including a planar upper surface. The method further includes forming an oxide hardmask layer on the planar upper surface of the organic planarizing layer. Dopant ions are implanted into the oxide hardmask layer to form a doped oxide hardmask layer. An EUV photosensitive resist layer is formed on the doped oxide hardmask layer. The EUV photosensitive resist layer is exposed and developed with an EUV light source to form at least one opening therein.

In one or more embodiments of the invention, the method includes forming an organic planarizing layer over topography formed on a semiconductor substrate, the organic planarizing layer including a planar upper surface. The method further includes forming an oxide hardmask layer on the planar upper surface of the organic planarizing layer. Dopant ions are implanted into the oxide hardmask layer to form a dopant oxide hardmask layer. An EUV photosensitive resist layer is formed on the doped oxide hardmask layer, wherein an amount of the dopant ions in the doped hardmask layer is tuned to the EUV photosensitive resist layer to provide adhesion therebetween effective to prevent lift off and scumming. The EUV photosensitive resist layer is exposed and developed with an EUV light source to form a patterned EUV photosensitive resist layer. The patterned EUV sensitive photoresist layer is transferred to the doped hardmask layer.

An EUV lithographic structure according to aspects of the invention include an EUV photosensitive resist layer and an oxide hardmask layer, wherein the oxide hardmask layer includes a plurality of dopant ions at a penetration depth equal to a patterned line width of the EUV photosensitive layer. The EUV lithographic structure is free of an antireflective layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Figure 1:
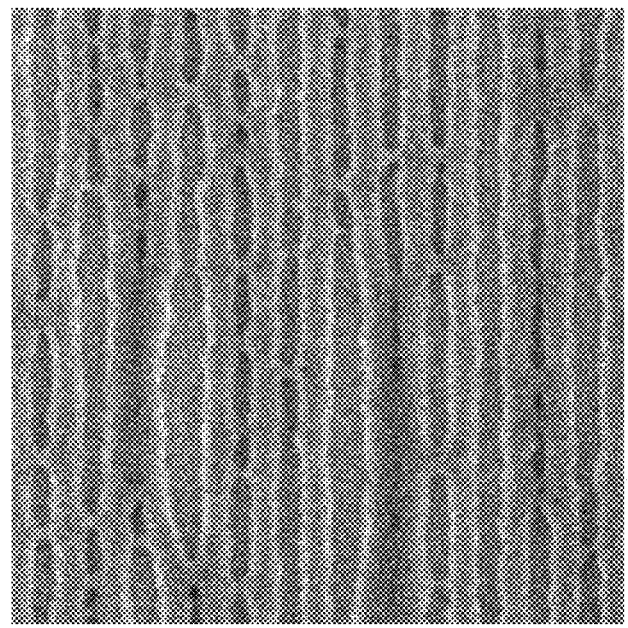
FIG. 1 depicts a top down scanning electron micrograph of an EUV photosensitive resist pattern directly on an oxide layer.
Figure 2:
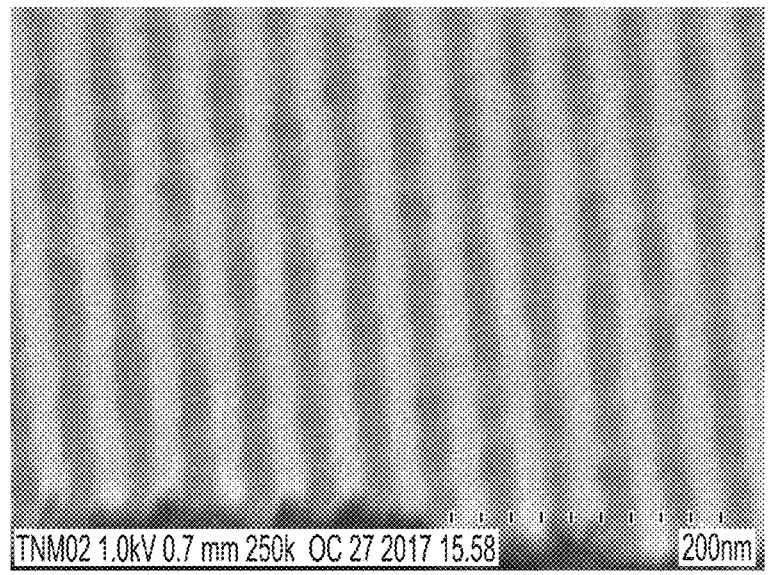
FIG. 2 depicts a tilted scanning electron micrograph of an EUV photosensitive resist pattern on a silicon antireflective layer.

EUV lithographic structures and methods for patterning an EUV photosensitive resist layer disposed directly on a surface of an oxide layer generally include implanting dopant ions into the oxide surface at a penetration depth effective to increase adhesion of the EUV photosensitive layer on the oxide layer. The dopant modified oxide surface can be tailored to a specific EUV photosensitive resist to provide sufficient adhesion effective to prevent pattern collapse typically resulting from weak adhesion and prevent scumming as well as residue defects resulting from too strong adhesion. By way of example, FIG. 1 depicts a top down scanning electron micrograph of a patterned EUV photosensitive resist deposited directly onto an oxide surface without any surface treatment, which clearly shows pattern collapse. The pattern collapse is indicative of poor adhesion of the EUV photosensitive resist to the oxide surface. In FIG. 2, a tilted scanning electron micrograph of a patterned EUV photosensitive resist deposited a silicon antireflective coating that had been deposited on an oxide layer. Thus, the EUV photosensitive resist is patterned and developed on the silicon antireflective coating and shows significant residues and scumming, which is indicative of too strong adhesion. In the present invention the EUV photosensitive resist is deposited directly onto the oxide layer, which has previously been subjected to implantation of dopant ions. As will be described herein, the adhesion between the EUV photosensitive resist and the oxide layer can be precisely controlled by implantation power and dose. Statistical design of experiments can be expeditiously done for any combination of oxide layer and EUV photosensitive resist compared to development of an adhesive layer specific to the EUV photosensitive resist and oxide, which can take many, many months of research and development. Advantageously, the EUV lithographic structure including the doped oxide layer can be used in multilayer patterning schemes.

Multilayer patterning schemes according to embodiments of the present invention generally includes an EUV photosensitive resist layer disposed directly on an oxide hardmask layer for patterning critical layers of advanced integrated circuits. A surface of the oxide hardmask layer is first doped with dopant ions to provide increased adhesion of the EUV photosensitive resist layer to the oxide hardmask layer. As will be discussed in greater detail herein, the multilayer EUV lithographic structure and process for via lithographic patterning markedly reduces costs because, unlike trilayer patterning schemes, an antireflective layer is not utilized. That is, the EUV photosensitive resist can be directly deposited onto the oxide hardmask layer for the lithography step. Patterning techniques employing the EUV lithographic structures include double patterning techniques such as, for example, a lithographic-etch sequence (LELE or LELELE). Alternative double patterning techniques can include sidewall image transfer process or self-aligned double patterning techniques.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

Figure 3:
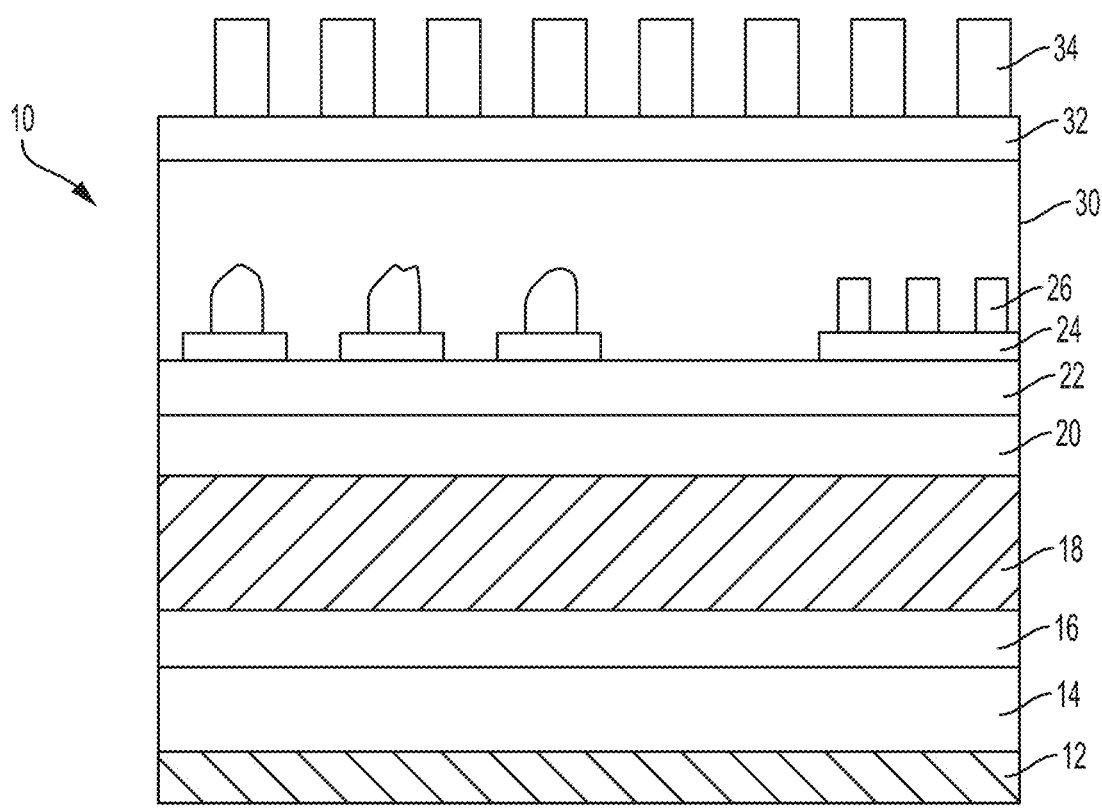
FIG. 3 depicts a cross section of the semiconductor structure following deposition and patterning of EUV photosensitive resist layer of an EUV lithographic structure in accordance with one or more embodiments of the invention.
Figure 4:
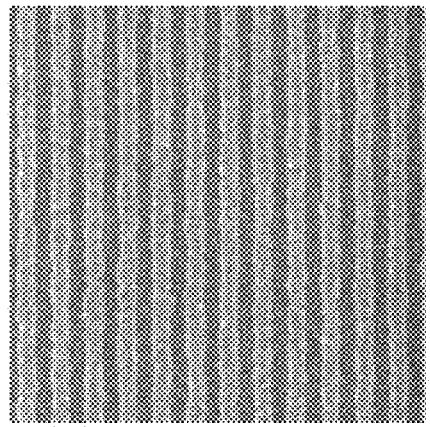
FIG. 4 depicts a top down scanning electron micrograph of an EUV photosensitive resist pattern directly on carbon doped oxide layer in accordance with one or more embodiments of the invention.
Figure 5:
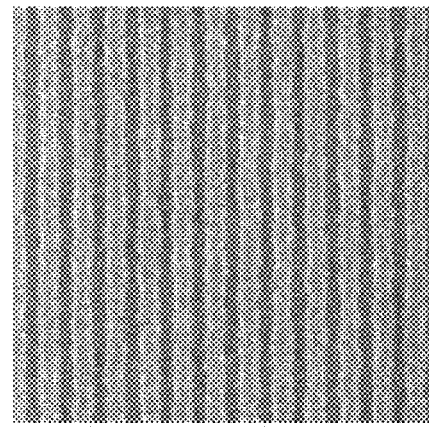
FIG. 5 depicts a top down scanning electron micrograph of an EUV photosensitive resist pattern directly on antimony doped oxide layer in accordance with one or more embodiments of the invention.

Referring now to FIG. 3, there is shown a cross sectional view of an exemplary semiconductor structure 10 at an intermediate stage of manufacturing for advanced design rules subsequent to deposition of a trilayer overlaying topographical features formed after hard mask open of an underlying metal layer 24 formed on a substrate 12. Hard mask open can be effected by reactive ion etching, for example. As will be readily apparent to those skilled in the art, the present EUV lithographic structure and process for lithographic patterning is applicable to a variety of technologies, e.g., NMOS, PMOS, CMOS, etc., and is readily applicable to a variety of devices, including, but not limited to, ASIC's, logic devices, memory devices, and the like.

The substrate 12 can include any semiconducting material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. Typically, the semiconductor substrate is a Si-containing semiconductor such as, for example, Si, SiC, SiGe, SiGeC, or a silicon-on-insulator. The substrate can be unstrained, strained or include regions of strain and unstrain therein. The substrate can be intrinsic or it can be doped with, for example, but not limited to boron, arsenic or phosphorous When SOI substrates are employed, those substrates include a top semiconductor layer and a bottom semiconductor layer that are separated at least in part by a buried insulating layer. The buried insulating layer includes, for example, a crystalline or non-crystalline oxide, nitride or any combination thereof. In one or more embodiments, the buried insulating layer is an oxide. Typically, the buried insulating layer is formed during initial stages of a layer transfer process or during an ion implantation and annealing process, such as, for example, SIMOX (separation by ion implantation of oxygen).

The exemplary semiconductor structure 10 at the intermediate stage of manufacturing can include various layers formed on the substrate 12. For example, the various layers can include any dielectric materials suitable for BEOL or MOL interconnect structures. In one or more embodiments, the various layers can include any gate materials suitable for FEOL structures. In other embodiments, the various layers can include can be a semiconductor material or a dielectric material on top of a semiconductor material.

The various layers are not intended to be limited to any particular number or type and will generally depend on the devices being manufactured. By way of example, the exemplary semiconductor structure 10 can includes layers 14, 16, 18, 20 and 22 upon which there are topographical features. The various layers can include dielectric layers, masking layers, antireflective layers and the like. For example, layer 14 can be a tetraorthosilicate layer as a precursor to silicon dioxide; layer 16 can be a NBlok ($SiC_xN_yH_z$) layer; layer 18 can be an ultralow k organic planarizing layer; layer 20 can be an organosilicon such as octylmethylcyclotetrasiloxane; and layer 22 can be tetraorthosilicate. The various layers can be deposited by chemical vapor deposition (CVD), plasma enhanced chemical vapor deposition (PECVD), low pressure chemical vapor deposition (LPCVD), atmospheric deposition as well as spin on techniques.

By way of example, layer 14 can be formed of tetraorthosilicate at a thickness of about 4000 to 6000 Angstroms; layer 16 can be formed of can be a NBlok ($SiC_xN_yH_z$) layer at a thickness of about 100 to 300 Angstroms; layer 18 can be formed of an ultralow k dielectric at a thickness of about 500 to 1000 Angstroms; layer 20 can be formed of octylmethylcyclotetrasiloxane at a thickness of about 10 to 200 Angstroms; and layer 22 can be formed of tetraorthosilicate at a thickness of about 50 to 200 Angstroms.

The exemplary semiconductor structure 10 further includes topographical features 26 formed on the hard mask metal layer 24 such as titanium nitride. The topographical features 26 can be formed of an oxide layer deposited on the hardmask 24 using known patterning techniques, e.g., sidewall image transfer or the like. By way of example, layer 24 can be titanium nitride at a thickness of about 100 to 400 Angstroms, and layer 26 from which the features are patterned therefrom can be a low temperature oxide at a thickness of about 500 to 1000 Angstroms.

The trilayer includes organic planarizing layer 30 deposited over the topographical features 26 and selected to form a planar upper surface after which an EUV lithographic structure in accordance with the present invention is formed thereon.

The organic planarization layer or spin-on carbon layer 30 can generally be a polymer including carbon, hydrogen, oxygen, and optionally nitrogen, fluorine, and silicon. In one or more embodiments, the planarization layer 30 is a polymer with sufficiently low viscosity so that the top surface of the applied polymer forms a planar top surface. In one or more other embodiments, the organic planarizing layer is a layer of material capable of being planarized by known chemical mechanical planarization processes. The organic planarization layer, which can be a spin-deposited layer, can be baked at an elevated temperature to cure the planarization layer, if needed, and reflow its top surface into a substantially planar form. In one or more embodiments, the thickness of the planarization layer can be about 50 nanometers to about 300 nanometers (nm), although lesser and greater thicknesses can also be employed.

An oxide hardmask 32 is formed on the planar surface defined by the planarization layer 30. The oxide hardmask can be an oxymetal including but not limited to silicon oxide (SiOx), titanium oxide (TiOx) or the like. Chemical vapor deposition (CVD) or atomic layer deposition (ALD) techniques can be used to deposit the metal containing oxide materials. In one or more embodiments, the thickness of the oxide hardmask 32 ranges from 3 nm to 35 nm. In one or more embodiments, the oxide can be a low temperature oxide carried out by LPCVD, PECVD using the following tool model "iRAD" commercially available from Tokyo Electron Limited (TEL), or the like. By way of example, the process of forming the low temperature oxides can include reaction of silane gas with oxygen to form a silicon dioxide layer as is known in the art.

Subsequent to formation of the oxide hardmask 32, the surface thereof is doped with a dopant, which functions to improve adhesion of the EUV photosensitive resist to the oxide hardmask, thereby enabling direct patterning of the EUV photosensitive resist on the oxide hardmask. The dose and power can be varied and optimized to provide the desired adhesion for a specific EUV photosensitive resist. Suitable dopant ions include, among others, carbon, phosphorous, boron, silicon and antimony. By way of example, the power and dose for carbon can be 0.5 to about 2 kilo-electron volts (keV) and 1E13 to about 1E16 ions/$cm^2$, respectively; for antimony a power of about 1.5 to about 3.5 keV and a dose of about 1E13 to about 1E16 ions/$cm^2$; for silicon a power of about 0.5 to about 3.8 keV and a dose of about 1E13 to about 1E16 ions/$cm^2$; and for phosphorous a power of about 0.5 to about 3.5 keV and a dose of about 1E13 to about 1E16 ions/$cm^2$. Penetration depth is a fraction of the oxide layer thickness and can range from 5 nm to 25 nm. The dopant ions do not penetrate the underlying layer, e.g., does not penetrate into the organic planarizing layer.

An EUV photosensitive resist layer 34 is deposited, patterned and developed on the oxide hardmask layer 32. Advantageously, a separate adhesive layer is not needed. Moreover, an antireflective layer is not included and is not a needed for EUV imaging of the EUV photosensitive resist layer 34 of the EUV lithographic structure. The EUV photosensitive resist layer 34 is not intended to be limited and can be a chemically amplified photoresist or a non-chemically amplified photoresist, e.g., inorganic or semi-inorganic, as is known in art. The thickness of the EUV photosensitive layer 34 will generally depend on the properties thereof and generally range from about 30 nm to about 50 nm.

In EUV lithography (EUVL) a high energy laser beam is used to vaporize a target material to produce a plasma which in turn, produces radiation of a characteristic wavelength. The composition of the target material generally determines the wavelength of the radiation produced. For 13 nm radiation, gold can be the target material although other target materials such as copper, tantalum, tungsten and antimony can be used. Alternatively, a synchrotron radiation source could be employed as the EUV source. The radiation is transmitted by a series of reflective mirrors to a mask. Due to high absorption at EUV wavelengths, a vacuum environment is typically required. The EUV photosensitive resist layer is exposed to the EUV radiation source and developed to form a relief pattern. The relief pattern can be used to provide a 1:1 line/space pitch pattern from 25 nm to 36 nm. The relief pattern can be transferred to the underlying layers by an etching process, e.g., a dry etch process such as a reactive ion etch process or a wet etch process.

Figure 6:
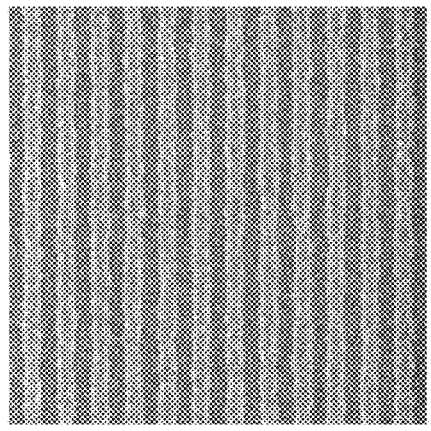
FIG. 6 depicts a top down scanning electron micrograph of an EUV photosensitive resist pattern directly on a silicon doped oxide layer in accordance with one or more embodiments of the invention.
Figure 7:
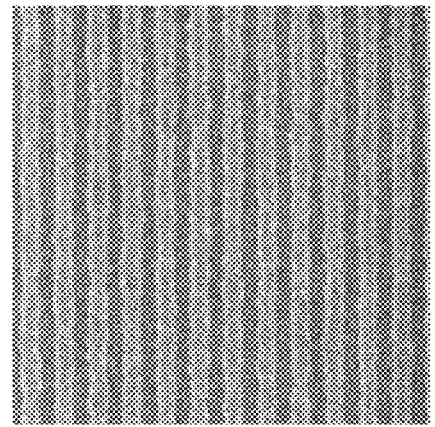
FIG. 7 depicts a top down scanning electron micrograph of an EUV photosensitive resist pattern directly on a phosphorous doped oxide layer in accordance with one or more embodiments of the invention.

FIGS. 2-5 depict scanning electron micrographs after lithographically patterning and developing a 1:1 line/space pattern at a pitch of 36 nm formed from an EUV photosensitive resist deposited directly on a SiOx hardmask layer. The EUV photosensitive resist was conventional commercial chemically amplified resist (CAR). In the top down scanning electron micrograph of FIG. 4, the SiOx hardmask was carbon doped at a power of 1.0 keV and a dose of 1E16 ions/$cm^2$. In the top down scanning electron micrograph of FIG. 5, the SiOx hardmask was antimony doped at a power of 2 keV and a dose of 5E15 ions/$cm^2$. In the top down scanning electron micrograph of FIG. 6, the SiOx hardmask was silicon doped at a power of 1.75 keV and a dose of 1E15 ions/$cm^2$. In the top down scanning electron micrograph of FIG. 7, the SiOx hardmask was phosphorous doped at a power of 1.75 keV and a dose of 1E15 ions/$cm^2$. As is evident from the micrographs, no liftoff or pattern collapse was observed. Moreover, no residue or scumming was present.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A method comprising:
    forming an organic planarizing layer over a semiconductor substrate, the organic planarizing layer including a planar upper surface;
    forming an oxide hardmask layer on the planar upper surface of the organic planarizing layer;
    implanting dopant ions into the oxide hardmask layer to form a doped oxide hardmask layer;
    forming an EUV photosensitive resist layer on the doped oxide hardmask layer; and
    exposing and developing the EUV photosensitive resist layer with an EUV light source to form at least one opening therein.

2. The method of claim 1 further comprising:
    transferring the opening in the EUV photosensitive resist layer to the oxide hardmask layer by reactive ion etching; and
    extending the at least one opening into the organic planarizing layer and to the substrate by reactive ion etching.

3. The method of claim 1, wherein the oxide hardmask layer comprises SiOx, or TiOx.

4. The method of claim 1, wherein the dopant ions comprise carbon, silicon, antimony, boron, or phosphorous.

5. The method of claim 1, wherein the at least one opening defines a plurality of 1:1 lines and spaces at a pitch from about 25 nm to about 36 nm.

6. The method of claim 1, wherein the dopant ions are carbon at a power and dose for carbon of about 0.5 to about 2 keV and 1E13 to about 1E16 ions/cm$^2$, respectively.

7. The method of claim 1, wherein the dopant ions are antimony at a power and dose of about 1.5 to about 3.5 keV and 1E13 to about 1E16 ions/cm$^2$, respectively.

8. The method of claim 1, wherein the dopant ions are silicon at a power and dose for silicon of about 0.5 to about 3.8 keV and 1E13 to about 1E16 ions/cm$^2$, respectively.

9. The method of claim 1, wherein the dopant ions are phosphorous at a power and dose of about 0.5 to about 3.5 keV and 1E13 to about 1E16 ions/cm$^2$, respectively.

10. The method of claim 1, wherein implanting dopant ions into the oxide hardmask layer comprises a power and dose effective to provide a penetration depth of a fractional thickness of the oxide layer ranging from about 5 nm to about 25 nm.

11. The method of claim 1, wherein the oxide hardmask layer is at a thickness of about 3 nm to about 35 nm and the EUV photosensitive resist is at a thickness of about 30 nm to about 50 nm.

12. The method of claim 1, wherein the EUV photosensitive resist is chemically amplified upon exposure to the EUV light source.

13. A method comprising:
    forming an organic planarizing layer over topography formed on a semiconductor substrate, the organic planarizing layer including a planar upper surface;
    forming an oxide hardmask layer on the planar upper surface of the organic planarizing layer;
    implanting dopant ions into the oxide hardmask layer to form a dopant oxide hardmask layer;
    forming an EUV photosensitive resist layer on the doped oxide hardmask layer, wherein an amount of the dopant ions in the doped hardmask layer is tuned to the EUV photosensitive resist layer to provide adhesion therebetween effective to prevent lift off and scumming;
    exposing and developing the EUV photosensitive resist layer with an EUV light source to form a patterned EUV photosensitive resist layer; and
    transferring the patterned EUV sensitive photoresist layer to the doped hardmask layer.

14. The method of claim 13, wherein the dopant ions are carbon at a power and dose for carbon of about 0.5 to about 2 KeV and 1E13 to about 1E16 ions/cm$^2$, respectively.

15. The method of claim 13, wherein the dopant ions are antimony at a power and dose of about 1.5 to about 3.5 KeV and 1E13 to about 1E16 ions/cm$^2$, respectively.

16. The method of claim 13, wherein the dopant ions are silicon at a power and dose for silicon of about 0.5 to about 3.8 KeV and 1E13 to about 1E16 ions/cm$^2$, respectively.

17. The method of claim 13, wherein the dopant ions are phosphorous at a power and dose of about 0.5 to about 3.5 KeV and 1E13 to about 1E16 ions/cm$^2$, respectively.

18. The method of claim 13, wherein the EUV photosensitive resist is chemically amplified upon exposure to the EUV light source.

* * * * *